(12) United States Patent
Hosoya et al.

(10) Patent No.: US 10,461,249 B2
(45) Date of Patent: Oct. 29, 2019

(54) MANUFACTURING METHOD OF MAGNETO-RESISTIVE EFFECT DEVICE

(71) Applicant: CANON ANELVA CORPORATION, Kawasaki-shi (JP)

(72) Inventors: Hiroyuki Hosoya, Kawasaki (JP); Yoshinori Nagamine, Kawsaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 16/046,157

(22) Filed: Jul. 26, 2018

(65) Prior Publication Data

US 2018/0331280 A1 Nov. 15, 2018

Related U.S. Application Data

(63) Continuation of application No. PCT/JP2016/000503, filed on Feb. 1, 2016.

(51) Int. Cl.
*H01L 43/12* (2006.01)
*C23C 14/18* (2006.01)
*C23C 14/34* (2006.01)
*C23C 14/54* (2006.01)
*H01L 43/10* (2006.01)

(52) U.S. Cl.
CPC ............ *H01L 43/12* (2013.01); *C23C 14/185* (2013.01); *C23C 14/3464* (2013.01); *C23C 14/541* (2013.01); *H01L 43/10* (2013.01)

(58) Field of Classification Search
None
See application file for complete search history.

(56) References Cited

U.S. PATENT DOCUMENTS

| | | |
|---|---|---|
| 7,479,394 B2 | 1/2009 | Horng et al. |
| 7,780,820 B2 | 8/2010 | Zhao et al. |
| 8,337,676 B2 | 12/2012 | Zhao et al. |

(Continued)

FOREIGN PATENT DOCUMENTS

| | | |
|---|---|---|
| JP | 2007-142424 A | 6/2007 |
| JP | 2007-173843 A | 7/2007 |

(Continued)

OTHER PUBLICATIONS

Written Opinion in International Application No. PCT/JP2016/000503 (dated Apr. 2016).

(Continued)

*Primary Examiner* — Charles D Garber
*Assistant Examiner* — Steven M Christopher
(74) *Attorney, Agent, or Firm* — Venable LLP

(57) ABSTRACT

A manufacturing method of a magneto-resistive effect device, the manufacturing method includes steps of: forming an Mg film on a substrate on which a reference layer is formed and oxidizing the Mg film to form an MgO layer on the reference layer; heating the substrate on which the MgO layer is formed; after the step of heating, forming an Mg layer on the MgO layer; cooling the substrate on which the Mg layer is formed; and forming a free layer on the Mg layer in a state where the substrate is cooled by the cooling step, and the step of forming the Mg layer, the step of cooling, and the step of forming the free layer are performed in the process same process chamber.

2 Claims, 7 Drawing Sheets

(56) References Cited

U.S. PATENT DOCUMENTS

| | | |
|---|---|---|
| 8,557,407 B2 | 10/2013 | Zhao et al. |
| 8,728,830 B2 | 5/2014 | Nishimura |
| 9,017,535 B2 | 4/2015 | Nagamine et al. |
| 9,502,644 B1 | 11/2016 | Nagamine et al. |
| 2009/0148595 A1* | 6/2009 | Nagamine ............ C23C 14/081 427/131 |
| 2009/0321246 A1 | 12/2009 | Tsunekawa et al. |
| 2010/0000855 A1* | 1/2010 | Nakamura ............ C23C 14/225 204/192.12 |
| 2010/0200394 A1 | 8/2010 | Nagamine et al. |
| 2011/0139606 A1* | 6/2011 | Tsunekawa ............ B82Y 10/11 204/192.15 |
| 2011/0143460 A1 | 6/2011 | Tsunekawa et al. |
| 2012/0288963 A1* | 11/2012 | Nishimura ............ B82Y 10/00 438/3 |
| 2013/0134032 A1 | 5/2013 | Tsunekawa et al. |
| 2015/0021725 A1* | 1/2015 | Hsu ........................ H01L 43/08 257/421 |

FOREIGN PATENT DOCUMENTS

| | | |
|---|---|---|
| JP | 2011-054238 A | 3/2011 |
| WO | 2007/066511 A1 | 6/2007 |
| WO | 2011/081203 A1 | 7/2011 |
| WO | 2017/134697 A1 | 8/2017 |

OTHER PUBLICATIONS

International Search Report in International Application No. PCT/JP2016/000503 (dated Apr. 2016).

* cited by examiner

FIG. 4A

| PROCESS STEP | PROCESS CHAMBER | |
|---|---|---|
| Etching | B | ETCHING STEP (10) |
| Buffer layer | F | PINNED LAYER FORMING STEP (11) |
| Pinning layer | F | |
| Pinned layer | D | REFERENCE LAYER FORMING STEP (12) |
| Interlayer | D | |
| Reference layer | D | |
| Ox | E | MgO FORMING STEP (13) |
| Mg | E | |
| Ox | E | |
| Mg | E | |
| Ox | E | |
| Heating | C | HEAT TREATMENT STEP (14) |
| Cooling (RT) | C | |
| Mg | A | Mg CAP FORMING STEP (15) |
| Cooling (LT) | A | COOLING STEP (16) |
| Free layer 1 | A | FREE LAYER FORMING STEP (17) WITH COOLING |
| Free layer 2 | F | FREE LAYER FORMING STEP (18) AT ROOM TEMPERATURE |
| Cap layer | F | CAP LAYER FORMING STEP (19) |

PROCESS ORDER ↓

FIG. 4B

| PROCESS STEP | PROCESS CHAMBER | |
|---|---|---|
| Etching | B | ETCHING STEP (10) |
| Buffer layer | F | } PINNED LAYER FORMING STEP (11) |
| Pinning layer | F | |
| Pinned layer | D | } REFERENCE LAYER FORMING STEP (12) |
| Interlayer | D | |
| Reference layer | D | |
| Ox | E | } MgO FORMING STEP (13) |
| Mg | E | |
| Ox | E | |
| Mg | E | |
| Ox | E | |
| Heating | C | } HEAT TREATMENT STEP (14) |
| Cooling (RT) | C | |
| Mg | E | Mg CAP FORMING STEP (15) |
| Cooling (LT) | A | COOLING STEP (16) |
| Free layer 1 | A | FREE LAYER FORMING STEP (17) WITH COOLING |
| Free layer 2 | F | FREE LAYER FORMING STEP (18) AT ROOM TEMPERATURE |
| Cap layer | F | CAP LAYER FORMING STEP (19) |

PROCESS ORDER ↓

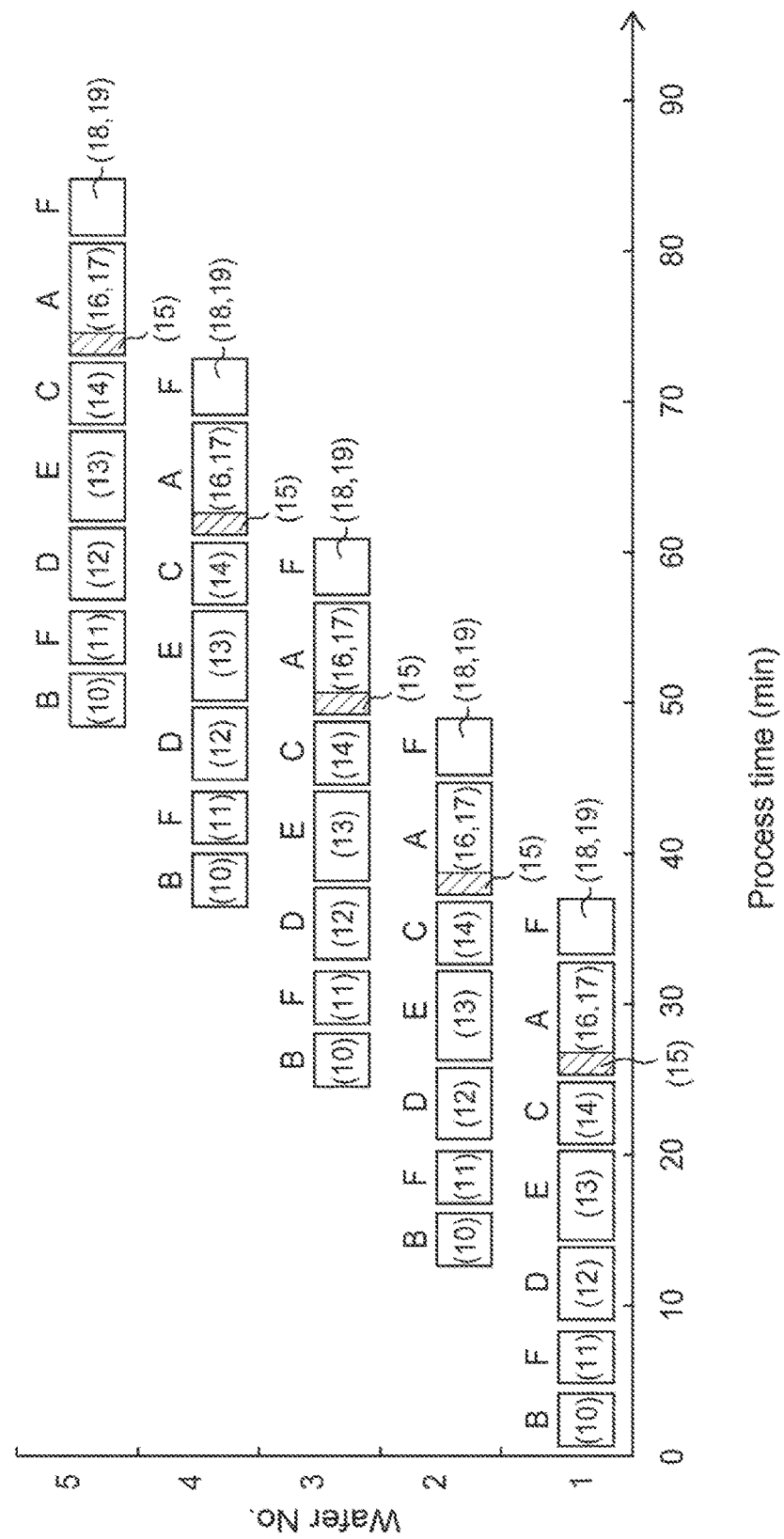

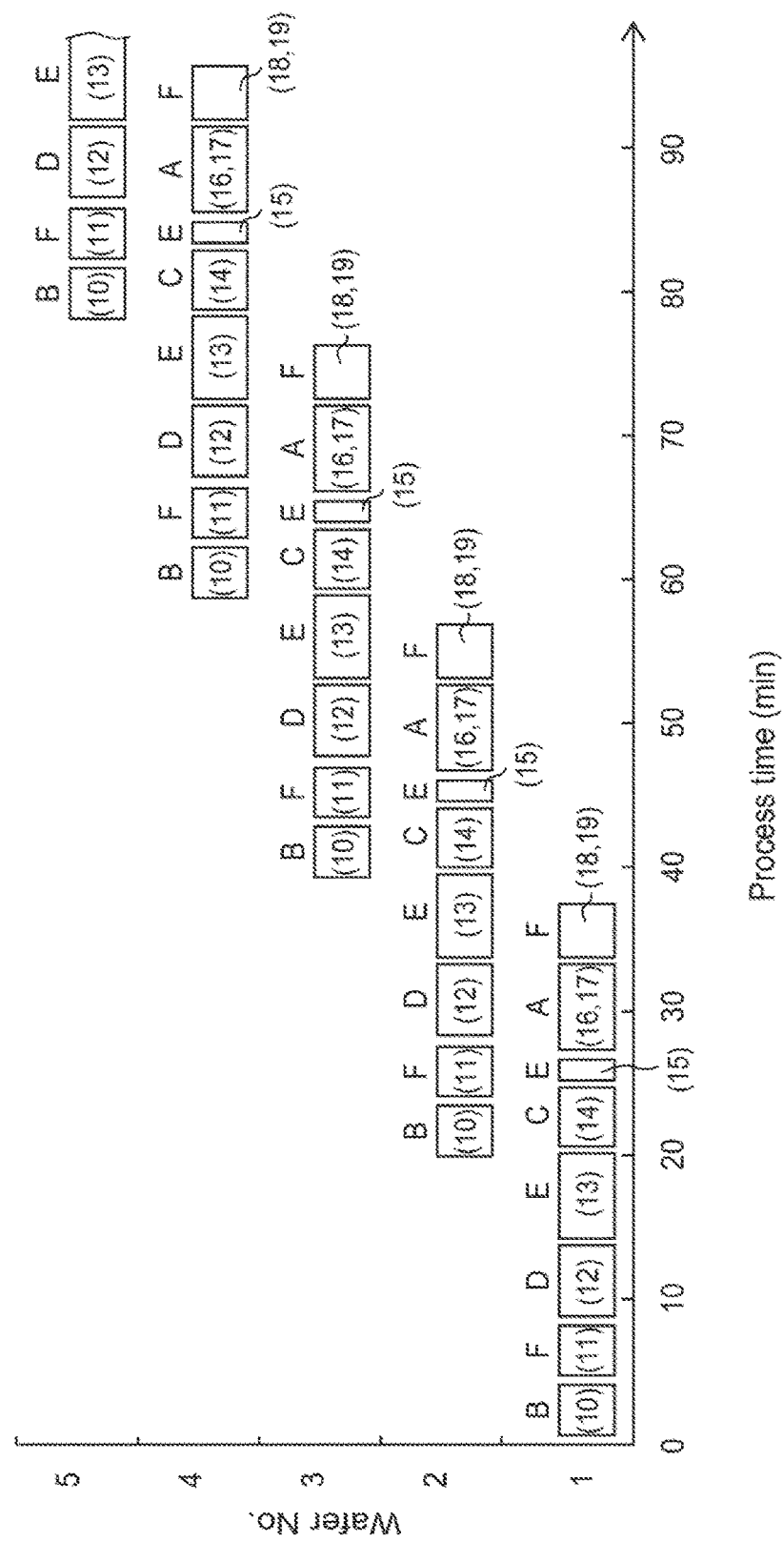

MANUFACTURING METHOD OF MAGNETO-RESISTIVE EFFECT DEVICE

CROSS-REFERENCES TO RELATED APPLICATIONS

This application is a continuation application of International Application No. PCT/JP2016/000503, filed Feb. 1, 2016. The contents of the aforementioned applications are incorporated herein by reference in their entireties.

TECHNICAL FIELD

The present invention relates to a manufacturing method of a magneto-resistive effect device, particularly to a manufacturing method of a magneto-resistive effect device suitable for a vertical TMR device used in an MRAM.

BACKGROUND ART

As a magneto-resistive effect device having an electrical resistance that varies depending on a magnetic field, a TMR device (also referred to as an MTJ device) that utilizes a Tunnel Magneto Resistance (TMR) effect to store information or detect magnetism is known. In recent years, MTJ devices are expected to be used for a Magnetic Random Access Memory (MRAM) or the like.

Patent Literature 1 discloses an MTJ device and a manufacturing method thereof. The MTJ device includes the structure in which a free layer (free magnetized layer), a tunnel barrier layer, and a reference layer (fixed magnetized layer) are stacked, and the magnetized directions of the free layer and the reference layer are in parallel to the stack direction, respectively.

In order to improve the characteristics of an MRAM device using an MTJ device, it is important to increase the magneto-resistive ratio (MR ratio). It is known that the stack structure of CoFeB/MgO/CoFeB disclosed in Patent Literature 1 exhibits a high MR ratio greater than 100%.

The MTJ device using a technology disclosed in Patent Literature 1 is an MTJ device having the bottom spin structure. The MTJ device of Patent Literature 1 has a CoFeB layer as a reference layer (fixed magnetized layer), a CoFeB layer as a free layer (free magnetized layer), and an MgO layer as a tunnel barrier layer interposed between the reference layer and the free layer. The MgO layer (tunnel barrier layer) is formed by forming an Mg film and oxidizing the Mg film. Further, in order to prevent diffusion of oxygen from the MgO layer to the free layer, an Mg layer is further formed on the MgO layer on the free layer (free magnetized layer) side of the MgO layer. The Mg layer formed on the free layer (free magnetized layer) side of the MgO layer is referred to as an Mg cap.

CITATION LIST

Patent Literature

Patent Literature 1: Japanese Patent Application Publication No. 2007-142424

SUMMARY OF INVENTION

Technical Problem

After forming of the Mg film and the oxidation treatment thereof are performed for forming the MgO layer (tunnel barrier layer), heat treatment for facilitating diffusion of oxygen to the Mg film is performed. Forming of the Mg cap is then performed after the heat treatment, and subsequently forming of the free layer is performed. Thus, before the forming of the free layer, a return transport step is required for putting a substrate (wafer) on which heat treatment has been performed back to a chamber used for Mg film forming and then forming the Mg cap. This return transport step makes the transport step of the substrate complex and may reduce the throughput of production.

The present invention has been made in view of the problem described above and intends to provide a manufacturing method of a magneto-resistive effect device that can simplify the transport step in manufacturing magneto-resistive effect devices and improve the throughput of production.

Solution to the Problem

A manufacturing method of a magneto-resistive effect device according to an aspect of the present invention includes steps of: forming an Mg film on a substrate on which a reference layer is formed, and oxidizing the Mg film to form an MgO layer on the reference layer; heating the substrate on which the MgO layer is formed; forming an Mg layer on the MgO layer after the step of heating; cooling the substrate on which the Mg layer is formed; and forming a free layer on the Mg layer in a state where the substrate is cooled by the cooling step, wherein the step of forming the Mg layer, the step of cooling, and the step of forming the free layer are performed in the same process chamber.

A manufacturing method of a magneto-resistive effect device according to an aspect of the present invention includes steps of: forming an Mg film on a substrate on which a reference layer is formed, and oxidizing the Mg film to form an MgO layer on the reference layer; heating the substrate on which the MgO layer is formed; forming an Mg layer on the MgO layer after the step of heating; cooling the substrate on which the Mg layer is formed; and forming a first free layer on the Mg layer in a state where the substrate is cooled by the cooling step; and forming a second free layer on the first free layer at a room temperature after the step of cooling, wherein the step of forming the Mg layer, the step of cooling, and the step of forming the first free layer are performed in the same process chamber, and the step of forming the second free layer is performed in a process chamber that is different from the same process chamber.

Advantageous Effects of Invention

According to the manufacturing method of the magneto-resistive effect device of the present invention, the throughput of production in manufacturing magneto-resistive effect devices can be improved.

BRIEF DESCRIPTION OF DRAWINGS

FIG. 4A is a process chart illustrating a manufacturing method of a magneto-resistive effect device according to one embodiment of the present invention.

FIG. 4B is a process chart illustrating a manufacturing method of a magneto-resistive effect device according to a comparative example.

FIG. 5A is a time chart illustrating a manufacturing method of magneto-resistive effect devices according to one embodiment of the present invention.

FIG. 5B is a time chart illustrating a manufacturing method of magneto-resistive effect devices according to the comparative example.

DESCRIPTION OF EMBODIMENTS

Figure 1:
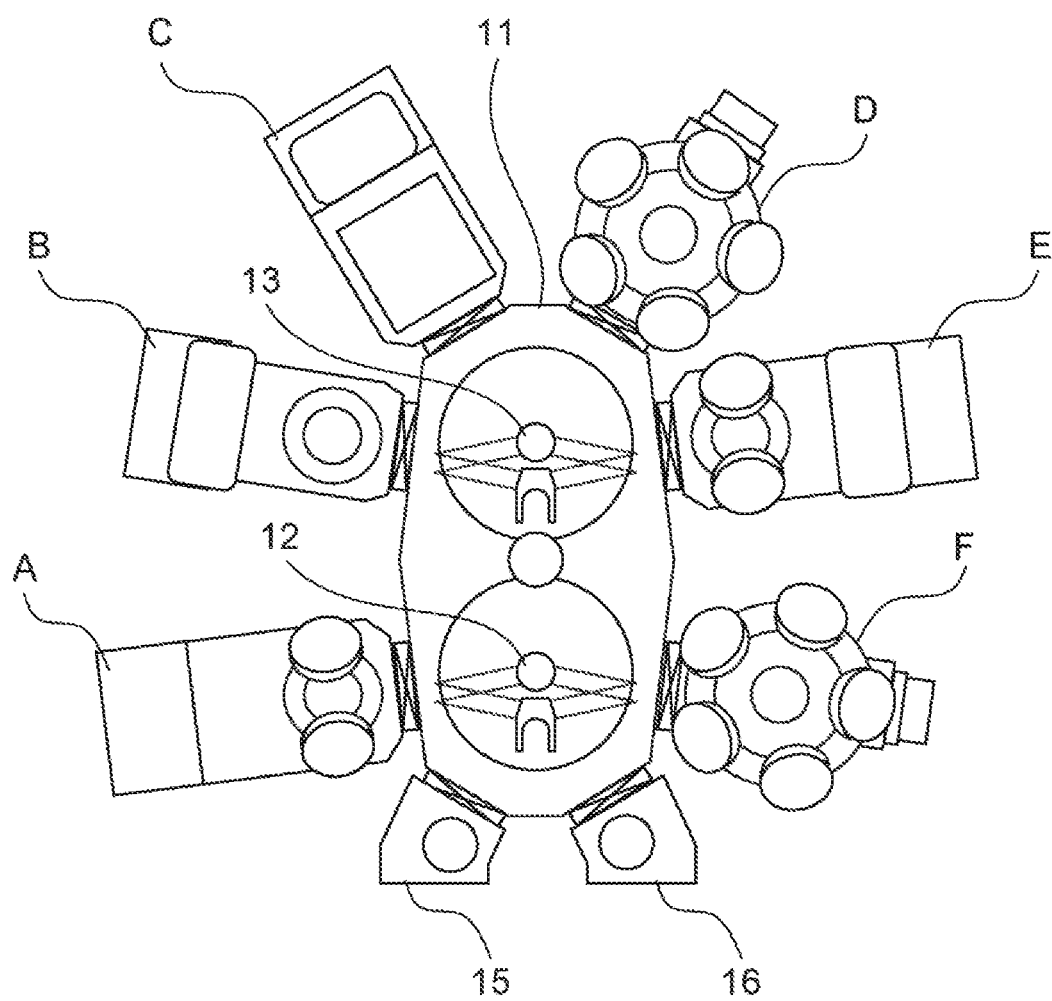
FIG. 1 is a schematic configuration diagram of a substrate processing system that performs a film forming process of magneto-resistive effect devices according to one embodiment of the present invention.

While an embodiment of the present invention will be described below with reference to the drawings, the present invention is not limited to the embodiment. Note that, in the drawings described below, those having the same function is labeled with the same reference symbols, and the duplicated description thereof may be omitted.

FIG. 1 is a schematic configuration diagram of a substrate processing system 10 that performs a film forming process of magneto-resistive effect devices according to the present embodiment. The substrate processing 10 is a cluster-type vacuum processing apparatus and has a transport chamber 11, a plurality of process chambers A to F, load lock chambers 15 and 16, and transport apparatuses 12 and 13. The plurality of process chambers A to F and the load lock chambers 15 and 16 are connected to the transport chamber 11 via gate valves. Substrates on which films are formed are transported by the transport apparatuses 12 and 13 provided inside the transport chamber 11 according to a predetermined process order among the load lock chambers 15 and 16 and respective process chambers A to F. An autoloader (not shown) for feeding a substrate to and outputting a substrate from processing system 10 is provided in the outside (on the side not connected to the transport chamber 11) of the load lock chambers 15 and 16.

The process chamber A is a chamber that performs sputtering and has target electrodes used for sputtering and a substrate holder on which a substrate is mounted during the sputtering. The process chamber A is able to perform forming of an Mg cap and a free layer (free magnetized layer). An Mg target and a CoFeB target or an Mg target and a CoFe target are provided to the target electrodes. The process chamber A will be further described based on FIG. 2.

The process chamber B is a plasma etching chamber and has an introduction apparatus for a discharge gas (Ar gas), discharge electrodes that make plasma from the discharge gas, and a substrate holder on which a substrate is mounted during the etching. The process chamber B is able to perform cleaning of a substrate by plasma etching.

The process chamber C is a heat treatment chamber and has a heating apparatus used for heating a substrate, a cooling apparatus used for cooling a substrate, and a substrate holder on which a substrate is mounted during the heating and cooling. The process chamber C is able to perform heat treatment of an MgO layer.

The process chamber D is a chamber that performs sputtering and has target electrodes used for the sputtering and a substrate holder on which a substrate is mounted during the sputtering. The process chamber D is able to perform forming of a pinned layer, a reference layer, and an interlayer. The target electrode is provided with a CoFe target as used for forming of the pinned layer, a Ru target as used for forming of the interlayer, and a CoFeB target as used for the reference layer.

The process chamber E is a chamber that performs sputtering and oxidation treatment and has target electrodes used for the sputtering, a substrate holder on which a substrate is mounted during the sputtering, and an oxygen introducing apparatus used for oxidation treatment. The target electrode is provided with an Mg target. The process chamber E is able to form an MgO layer.

The process chamber F is a chamber that performs sputtering and has target electrodes used for the sputtering and a substrate holder on which a substrate is mounted during the sputtering. The target electrode is provided with Ta, Ru, IrMn, CoFeB, or NiFe target. The process chamber F is able to perform forming films of Ta/Ru as a buffer layer, IrMn as an antiferromagnetic layer (pinning layer), CoFeB/NiFe as a free layer, and Ru/Ta as a cap layer.

Figure 2:
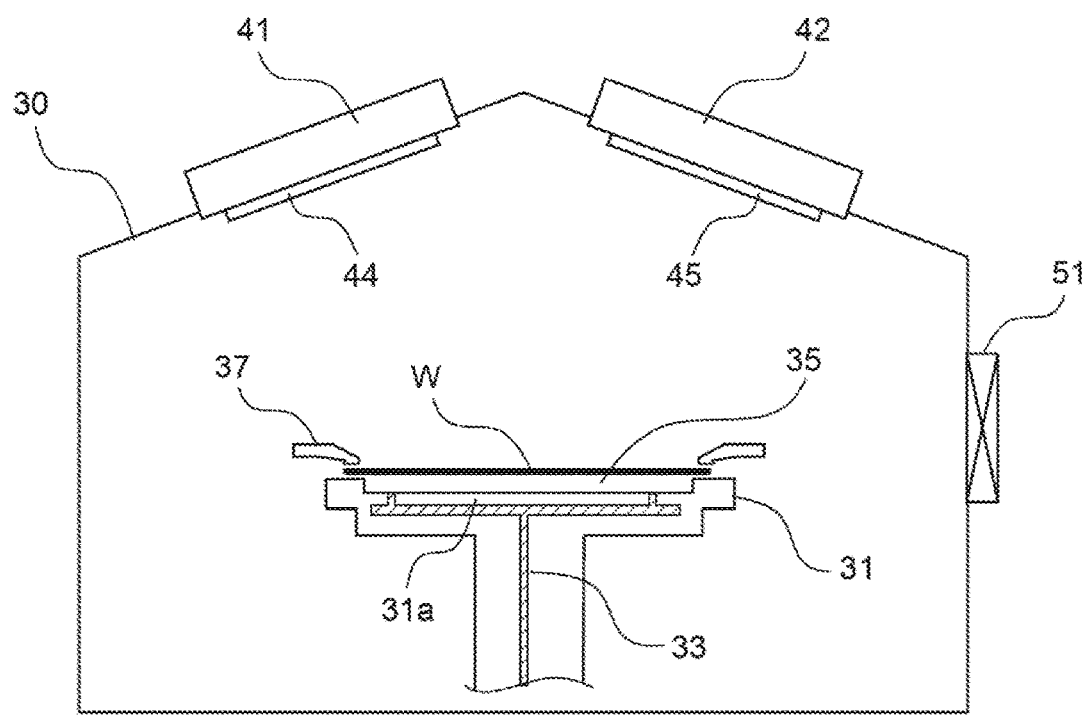
FIG. 2 is a schematic configuration diagram of a process chamber according to one embodiment of the present invention.

FIG. 2 is a schematic configuration diagram of the process chamber A according to the present embodiment. The process chamber A has target electrodes (cathode electrodes) 41 and 42, targets 44 and 45, a substrate holder 31, and a ring 37 suppressing a substrate (wafer) W inside a container 30 that can be vacuumed. For example, the target 44 is an Mg target, and the target 45 is a magnetic material target such as CoFeB, CoFe, or the like. The top surface (substrate mounting surface) of the substrate holder 31 is shaped such that a gap 35 is formed between the substrate holder 31 and the backside of the substrate W in a state where the substrate W is mounted.

A gas introducing line 33 that introduces a cooling gas into the gap 35 is provided inside the substrate holder 31. Ar or He is used for the cooling gas. The container 30 is connected to the transport chamber 11 via the valve 51. The transport apparatus 12 is configured to be able to mount the substrate W on the substrate holder 31 via the gate valve 51.

A portion (a cooling surface 31a) of the substrate holder 31 that faces the gap 35 is cooled by a not-shown cooling apparatus. Known cooling means such as a refrigerant circulation such as a liquid nitrogen, a Gifford-McMahon (GM) cooler, or the like can be employed for the cooling apparatus. The substrate holder 31 can cool the substrate W by introducing a cooling gas into the gap 35 to use a heat exchange operation of the cooling gas. Further, the substrate holder 31 can exhaust the cooling gas from the gap 35. In a state where no cooling gas is introduced into the gap 35, even when the cooling surface 31a is cooled, the substrate W is not cooled because there is no cooling gas for heat exchange between the cooling surface 31a and the substrate W. That is, in a process performed with no cooling gas being introduced into the gap 35, the temperature of the substrate W remains at a room temperature. In the following description, a state of cooling the cooling surface 31a and introducing a cooling gas into the gap 35 is referred to as a cooling mode, and a state of introducing no cooling gas into the gap 35 regardless of whether or not to cool the cooling surface 31a is referred to as a non-cooling mode. The substrate holder 31 can select any one of the cooling mode and the non-cooling mode.

Figure 3:
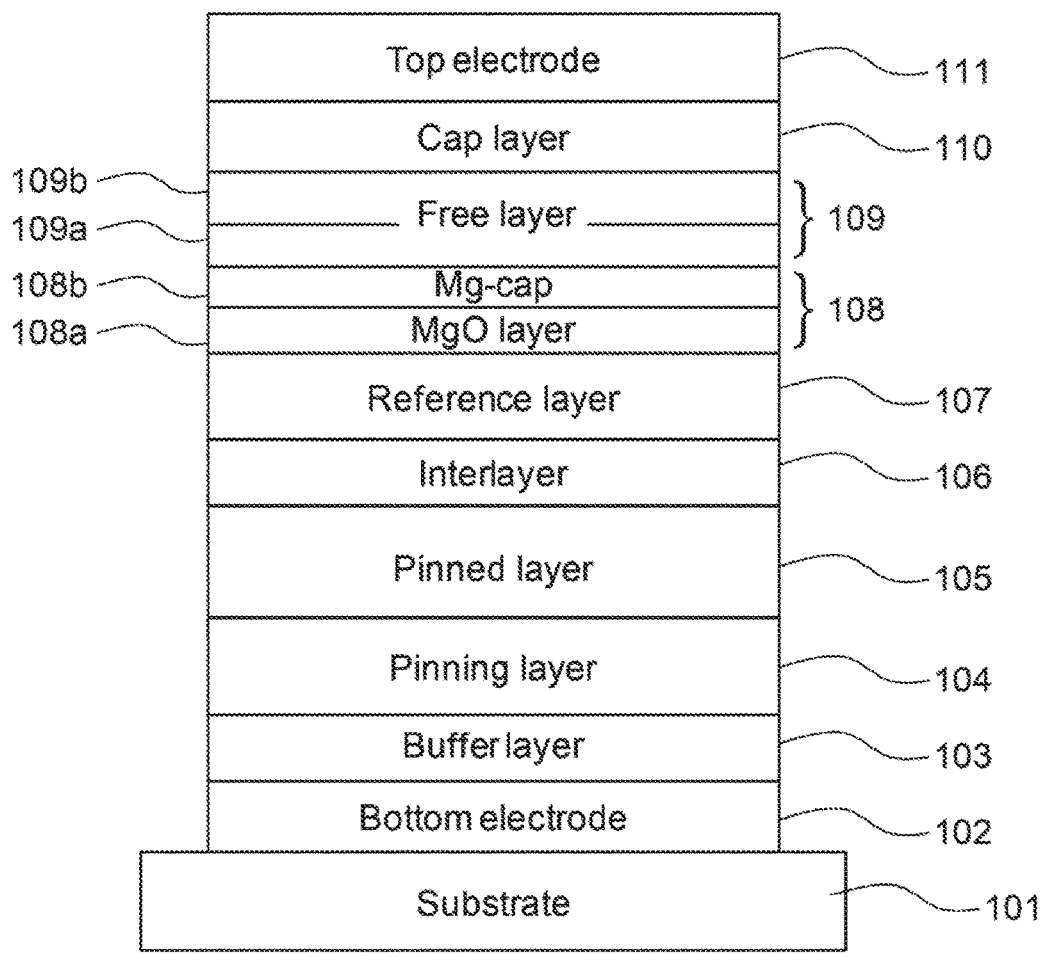
FIG. 3 is a schematic diagram illustrating a configuration of an exemplary MTJ device subjected to a film forming process according to one embodiment of the present invention.

FIG. 3 is a schematic diagram illustrating an exemplary configuration of a Magnetic Tunnel Junction (MTJ) device 100 subjected to the film forming process according to the present embodiment. The MTJ device 100 is used for an MRAM, a magnetic sensor or the like, for example.

The MTJ device 100 is an MTJ device of the bottom pin structure. The MTJ device 100 has a bottom electrode 102 on the substrate 101 and a buffer layer 103 consisted of a Ta/Ru layer. Furthermore, the MTJ device 100 has a pinning layer 104 made of IrMn that is an antiferromagnetic material and a pinned layer 105 made of CoFe that is a ferromagnetic material.

On the pinned layer 105, the MTJ device 100 has an interlayer 106 made of Ru and a reference layer 107 made of CoFeB that is a ferromagnetic material. The pinned layer 105 is a synthetic antiparallel pinned layer that is magnetically coupled to the reference layer 107 via the interlayer 106. Furthermore, on the reference layer 107, the MTJ device 100 has a tunnel barrier layer 108, a free layer 109 consisted of multilayered films including CoFeB, CoFe, and/or NiFe, a cap layer 110, and a top electrode 111.

The tunnel barrier layer 108 is consisted of an MgO layer 108a and an Mg cap 108b. The Mg cap 108b is formed on the free layer 109 side of the MgO layer 108a. The MgO layer 108a is formed by repeating Mg film forming and oxidation treatment. The Mg cap 108b has an advantageous effect of preventing diffusion of oxygen from the MgO layer 108a to the free layer 109.

The free layer 109 is consisted of a first free layer 109a and a second free layer 109b. While the first free layer 109a and the second free layer 109b have the same component or the same function, the temperature for forming the first free layer 109a and the temperature for forming the second free layer 109b are different from each other as described later.

Note that, without being limited to the configuration illustrated in the present embodiment, the MTJ device 100 may have a configuration with any change such as an increase or decrease of the number of layers, change of the materials forming respective layers, inversion of the vertical stack order, or the like, as long as it is configured to have the Mg cap in the MgO layer and as far as the function of the MTJ device is not lost.

FIG. 4A is a process chart illustrating a manufacturing method of the MTJ device 100 according to the present embodiment. The MTJ device 100 is manufactured by using the cluster-type substrate processing system 10 illustrated in FIG. 1, and the Mg cap 108b is formed in the process chamber A illustrated in FIG. 2.

First, the substrate processing system 10 moves the substrate W transported in the load lock chambers 15 and 16 to the process chamber B. The substrate processing system 10 performs etching process (etching step) in the process chamber B. In the etching process, impurities or the like attached on the surface of the substrate W are removed by using an etching method.

Next, the substrate processing system 10 moves the substrate W to the process chamber F. The substrate processing system 10 forms the buffer layer 103 and subsequently forms the pinning layer 104 in the process chamber F (pinned layer forming step).

Next, the substrate processing system 10 moves the substrate W to the process chamber D. The substrate processing system 10 forms the pinned layer 105 and the interlayer 106 in the process chamber D and further forms a CoFeB layer as the reference layer 107 (reference layer forming step).

Next, the substrate processing system 10 moves the substrate W to the process chamber E. The substrate processing system 10 forms the MgO layer 108 in the process chamber E (MgO layer forming step). The MgO layer 108a is formed by repeating of Mg film forming by sputtering and oxidation treatment of the Mg layer by oxygen introduction. While any number of repetitions of the Mg film forming and the oxidation treatment may be employed, the number is two in the present embodiment. Further, in the present embodiment, before the first Mg film forming for the MgO layer 108a is performed, oxygen introduction (pre-oxidation treatment) is performed. The pre-oxidation treatment allows for more uniform Mg oxidation of the MgO layer 108a.

After the MgO layer forming step is performed, the substrate processing system 10 moves the substrate W to the process chamber C. The substrate processing system 10 performs heat treatment of the substrate W (heat treatment step). The heat treatment is performed for the purpose of improving a crystallinity of the MgO layer 108a, and the substrate is heated up to a temperature from 300 degrees Celsius to 400 degrees Celsius. In the cooling step performed later, the substrate W is cooled down to below −100 degrees Celsius, and thus the substrate W may be cracked due to a sudden temperature change. In order to prevent this, after the completion of the heat treatment, a step of cooling the substrate W down to the room temperature is performed in the process chamber C. The cooling of the substrate down to the room temperature is performed by heat exchange by using a cooling gas with the substrate W being mounted on the substrate holder that is cooled by water.

After the heat treatment step is performed, the substrate processing system 10 moves the substrate W to the process chamber A. The substrate processing system 10 forms the Mg cap 108b on the MgO layer 108a in the process chamber A (Mg cap forming step). The Mg cap forming step has an advantageous effect of absorbing excessive oxygen present on the surface of the MgO layer 108a formed by oxidation and preventing oxidation of the free layer 109 formed after the Mg cap. The Mg cap forming step requires the substrate temperature above the room temperature because of the nature thereof.

The cooling surface 31a of the substrate holder 31 provided inside the process chamber A is cooled at an extremely low temperature below −100 degrees Celsius. In a state where no medium (cooling gas) for heat exchange is introduced into the gap 35, however, the substrate W is not cooled even when mounted on the substrate holder 31 and film forming can be performed in a state where the substrate temperature is the room temperature. As used herein, the room temperature refers to a temperature in a state of not being cooled (non-cooling mode). The forming of the Mg cap 108b is performed in the non-cooling mode.

Next, the substrate processing system 10 cools the substrate W down to an extremely low temperature below −100 degrees Celsius in the same process chamber A (cooling step). The cooling of the substrate W is performed by introducing a medium (cooling gas) into the gap 35 of the substrate holder 31 (cooling mode).

Next, the substrate processing system 10 forms the first free layer 109a in a state where the substrate W is cooled (cooling mode) in the same process chamber A (free layer forming step with cooling). The first free layer 109a is a part of the free layer 109.

Next, the substrate processing system 10 moves the substrate W to the process chamber F. The substrate processing system 10 forms the second free layer 109b at the room temperature in the process chamber F (free layer forming step at room-temperature). The second free layer 109b is a part of the free layer 109, and the first free layer 109a and the second free layer 109b consisted of the free layer 109.

When the free layer 109 is formed, a portion on the Mg cap 108b side of the free layer 109 has to be cooled, and both of the first free layer 109a and the second free layer 109b may be formed in a state where the substrate W is cooled (free layer forming step). The free layer forming step with cooling and the free layer forming step at room-temperature are collectively referred to as a free layer forming step.

Finally, the substrate processing system 10 forms the cap layer 110 in the same process chamber F (cap layer forming step).

FIG. 4B is a process chart illustrating a manufacturing method of an MTJ device of a comparative example. In the comparative example, the Mg cap forming step is performed in the process chamber E in which the MgO layer forming step is performed instead of in the process chamber A in which the cooling step and the free layer forming step with cooling are performed. That is, after performing the heat treatment step in the process chamber C, the substrate processing system again moves the substrate W to the process chamber E. After performing the Mg cap forming step in the process chamber E, the substrate processing system then moves the substrate W to the process chamber A. Thus, the number of times of transportation of the substrate W among the process chambers increases (return transportation), and the throughput of production decreases. In contrast, in the manufacturing method of the present embodiment (FIG. 4A), since the Mg cap forming step is performed in the process chamber A in which the cooling step is performed, the number of times of transportation of the substrate W among the process chambers can be reduced compared to the comparative example.

FIG. 5A is a time chart illustrating a manufacturing method of the MTJ devices 100 according to the present embodiment. FIG. 5A illustrates a time chart of process steps in the process chambers A to F where five substrates (No. 1 to 5) stay (including transport time). Respective process steps are depicted by a square, and the reference symbols provided thereto correspond to the process steps (10) to (19) of FIG. 4A.

In the present embodiment (FIG. 5A), the Mg cap forming step (15) is performed in the process chamber A in which the cooling step (16) is performed, it is therefore possible to perform film forming process of the substrate W of another number in the process chamber E during the Mg cap forming step (15). For example, before the Mg cap forming step (15) of the substrate of No. 1 ends in the process chamber A, it is possible to start the MgO layer forming step (13) of the substrate of No. 2 in the process chamber E. In the present embodiment, the process time per substrate can be reduced by 20% compared to the comparative example.

FIG. 5B is a time chart illustrating a manufacturing method of the MTJ devices of the comparative example. In a similar manner to FIG. 5A, FIG. 5B illustrates a time chart of process steps in the process chambers A to F where five substrates (No. 1 to 5) stay (including transport time). Respective process steps are depicted by a square, and the reference symbols provided thereto correspond to the process steps (10) to (19) of FIG. 4B.

In the comparative example, the MgO layer forming step (13) and the Mg cap forming step (15) are performed in the same process chamber E, and therefore, unlike the present embodiment (FIG. 5A), the MgO layer forming step (13) and the Mg cap forming step (15) cannot be performed in parallel for two substrates. For example, it is necessary to delay the start of the MgO layer forming step (13) for the substrate of No. 2 until at least the Mg cap forming step (15) for the substrate of No. 1 ends.

As described above, according to the manufacturing method of the present embodiment, it is possible to simplify the transport step in manufacturing magneto-resistive effect devices and improve the throughput of production of the magneto-resistive effect devices.

LIST OF REFERENCE SYMBOLS

10: substrate processing system
A-F: process chamber
11: transport chamber
12, 13: transport apparatus
15, 16: load lock chamber
100: MTJ device (bottom pin structure)
107: reference layer
108a: MgO layer
108b: Mg cap
109: free layer
109a: first free layer
109b: second free layer

The invention claimed is:

1. A manufacturing method of a magneto-resistive effect device, the manufacturing method comprising steps of:
    forming an Mg film on a substrate on which a reference layer is formed, and oxidizing the Mg film to form an MgO layer on the reference layer;
    heating the substrate on which the MgO layer is formed;
    forming an Mg layer on the MgO layer after the step of heating;
    cooling the substrate on which the Mg layer is formed;
    forming a first free layer on the Mg layer in a state where the substrate is cooled by the cooling step; and
    forming a second free layer on the first free layer at a room temperature after the step of cooling,
    wherein the step of forming the Mg layer, the step of cooling, and the step of forming the first free layer are performed in the same process chamber, and the step of forming the second free layer is performed in a process chamber that is different from the same process chamber.

2. The manufacturing method of the magneto-resistive effect device according to claim 1,
    wherein the same process chamber comprises an Mg target used for forming the Mg layer, a magnetic material target used for forming the first free layer, and a substrate holder on which the substrate is mounted,
    wherein a substrate mounting surface of the substrate holder has such a shape that a gap is formed between the substrate and the substrate mounting surface in a state where the substrate is mounted, the substrate holder is configured to select a cooling mode for introducing a cooling gas into the gap to cool the substrate or a non-cooling mode for introducing no cooling gas into the gap not to cool the substrate,
    wherein the step of forming the Mg layer is performed in the non-cooling mode, and
    wherein the step of cooling is performed in the cooling mode.

* * * * *